US 11,574,868 B2

(12) United States Patent
Kim et al.

(10) Patent No.: US 11,574,868 B2
(45) Date of Patent: Feb. 7, 2023

(54) FAN-OUT SEMICONDUCTOR PACKAGES

(71) Applicant: Samsung Electronics Co., Ltd., Suwon-si (KR)

(72) Inventors: Joonsung Kim, Suwon-si (KR); Khaile Kim, Sejong-si (KR)

(73) Assignee: Samsung Electronics Co., Ltd.

( * ) Notice: Subject to any disclaimer, the term of this patent is extended or adjusted under 35 U.S.C. 154(b) by 205 days.

(21) Appl. No.: 17/022,718

(22) Filed: Sep. 16, 2020

(65) Prior Publication Data

US 2021/0183762 A1 Jun. 17, 2021

(30) Foreign Application Priority Data

Dec. 16, 2019 (KR) .................. 10-2019-0168140

(51) Int. Cl.
*H01L 23/00* (2006.01)
*H01L 23/528* (2006.01)
*H01L 23/31* (2006.01)
*H01L 23/498* (2006.01)

(52) U.S. Cl.
CPC ........ *H01L 23/528* (2013.01); *H01L 23/3178* (2013.01); *H01L 23/49861* (2013.01); *H01L 24/05* (2013.01)

(58) Field of Classification Search
CPC ............... H01L 23/528; H01L 23/3178; H01L 23/49861; H01L 24/05; H01L 23/145; H01L 24/19; H01L 24/20; H01L 23/13; H01L 23/49816; H01L 23/5389; H01L 2225/1011; H01L 2225/1035; H01L 2225/1058; H01L 25/10; H01L 25/105; H01L 23/3128; H01L 23/04; H01L 23/31; H01L 23/525; H01L 24/06
See application file for complete search history.

(56) References Cited

U.S. PATENT DOCUMENTS

| | | |
|---|---|---|
| 8,900,931 B2 | 12/2014 | Liang |
| 10,032,734 B2 | 7/2018 | Huang et al. |
| 10,147,692 B2 | 12/2018 | Chen et al. |
| 10,153,219 B2 | 12/2018 | Jeon et al. |
| 10,332,855 B2 | 6/2019 | Lee et al. |
| 2017/0365572 A1* | 12/2017 | Lee ..................... H01L 21/4857 |

FOREIGN PATENT DOCUMENTS

JP 5042607 10/2012
KR 1020090016836 2/2009

* cited by examiner

*Primary Examiner* — Elias Ullah
(74) *Attorney, Agent, or Firm* — Myers Bigel, P.A.

(57) ABSTRACT

A fan-out semiconductor package includes a frame substrate having a through hole therein, a semiconductor chip in the through hole, wherein the semiconductor chip includes a chip body, a chip pad on a surface of the chip body and a passivation layer on the chip body and on the chip pad, an encapsulation layer on side surfaces of the semiconductor chip within the through hole, and a guard ring on the passivation layer and on an edge portion of the chip body.

20 Claims, 21 Drawing Sheets

FAN-OUT SEMICONDUCTOR PACKAGES

CROSS-REFERENCE TO RELATED APPLICATION

This application claims the benefit of and priority to Korean Patent Application No. 10-2019-0168140, filed on Dec. 16, 2019, in the Korean Intellectual Property Office, the disclosure of which is incorporated herein in its entirety by reference.

BACKGROUND

The inventive concepts relate to semiconductor packages, and more particularly, to fan-out semiconductor packages.

As the electronics industry has been rapidly developed and the need of users has increased, electronic devices become smaller and lighter. Thus, semiconductor chips, which are core components of electronic devices, are gradually decreasing in size. Because a space between solder balls on the semiconductor chip may be determined by standards of the World Semiconductor Standards Association, it is not easy to control the number of solder balls for the semiconductor chip. In order to solve this problem, a fan-out semiconductor package has been proposed.

SUMMARY

The inventive concepts provide fan-out semiconductor packages having a reliable structure.

According to an aspect of the inventive concepts, there is provided a fan-out semiconductor package including a frame substrate having a through hole therein, a semiconductor chip in the through hole, wherein the semiconductor chip includes a chip body, a chip pad on a surface of the chip body and a passivation layer on the chip body and on the chip pad, an encapsulation layer on side surfaces of the semiconductor chip within the through hole, and a guard ring on the passivation layer above an edge portion of the chip body.

According to another aspect of the inventive concepts, there is provided a fan-out semiconductor package including a frame substrate having a through hole therein, a semiconductor chip in the through hole, wherein the semiconductor chip includes a chip body, at least one chip pad on a surface of the chip body, a capping layer on the at least one chip pad, and a passivation layer on the chip body, on sides of the at least one chip pad, and on part of the capping layer, an encapsulation layer on side surfaces of the semiconductor chip within the through hole, and a guard ring on the passivation layer and on an edge portion of the chip body, the guard ring and having a top surface at a level that is equal to or higher than the top surface of the encapsulation layer.

According to another aspect of the inventive concepts, there is provided a fan-out semiconductor package including a frame substrate having a through hole therein, a semiconductor chip in the through hole, wherein the semiconductor chip includes a chip body, at least one chip pad on a surface of the chip body, and a passivation layer on the chip body and on side surfaces of the at least one chip pad, an encapsulation layer on side surfaces of the semiconductor chip within the through hole, and a guard ring on the passivation layer and on an edge portion of the chip body, the guard ring having a top surface at a level that is equal to or higher than a top surface of the encapsulation layer.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
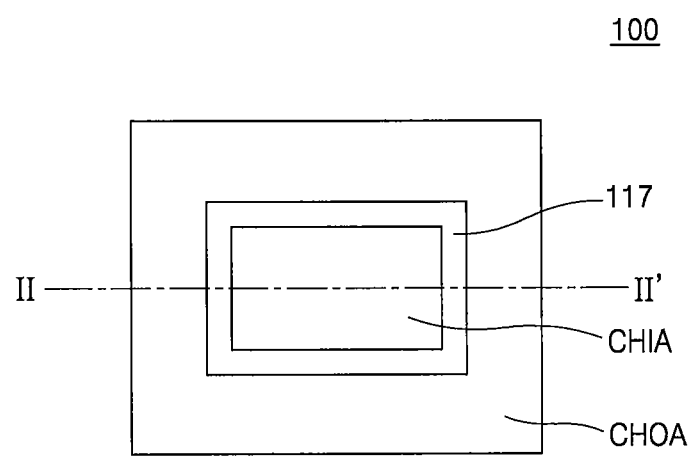
FIG. 1 is a plan view schematically illustrating a fan-out semiconductor package according to an embodiment of the inventive concepts.

Hereinafter, embodiments of the inventive concepts will be described in detail with reference to the accompanying drawings. The same or similar reference numerals will be used for the same elements in the drawings, and a redundant description thereof will be briefly provided or omitted. In the following description, a top surface and a bottom surface may be relative concepts according to the position of the drawings, and a first surface and a second surface may also be relative concepts according to the position of the drawings.

Figure 2:
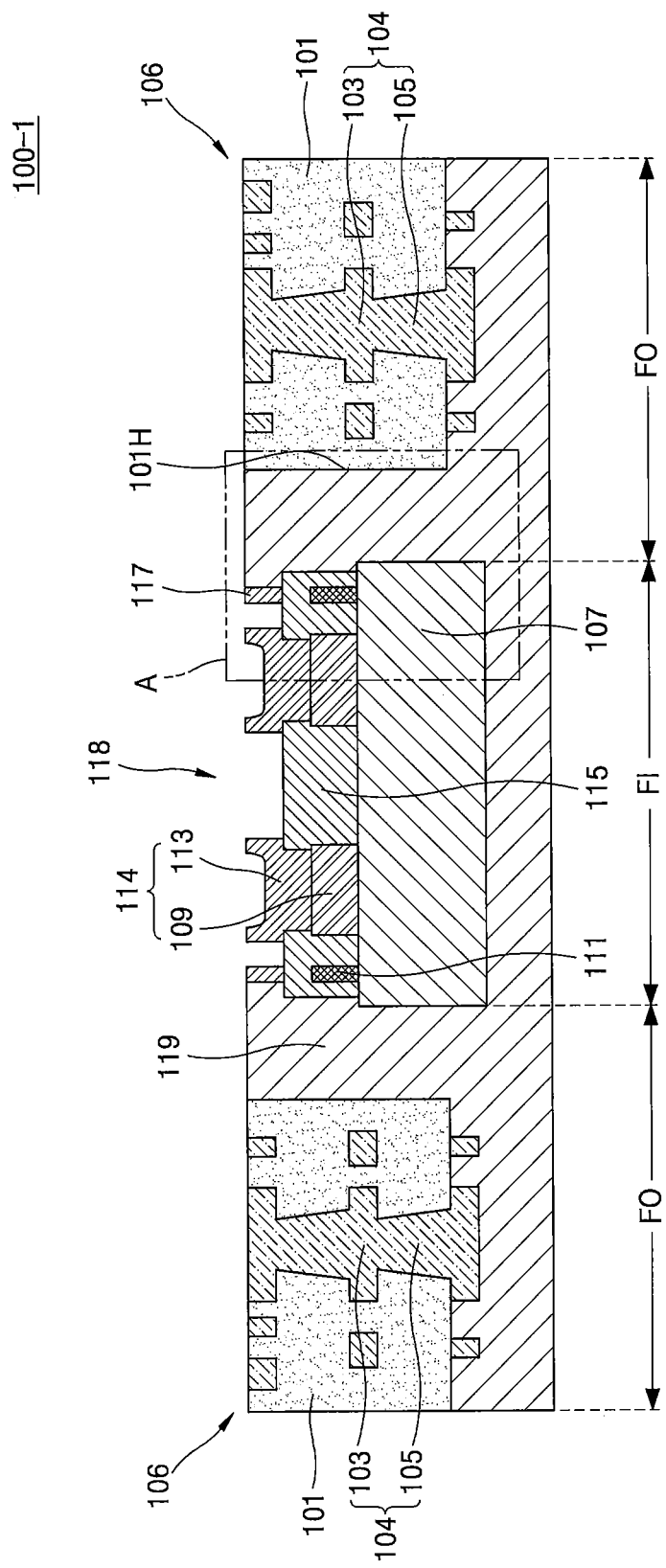
FIG. 2 is a cross-sectional view of components of a fan-out semiconductor package according to an embodiment of the inventive concepts, taken along a line II-II' of FIG. 1.
Figure 3:
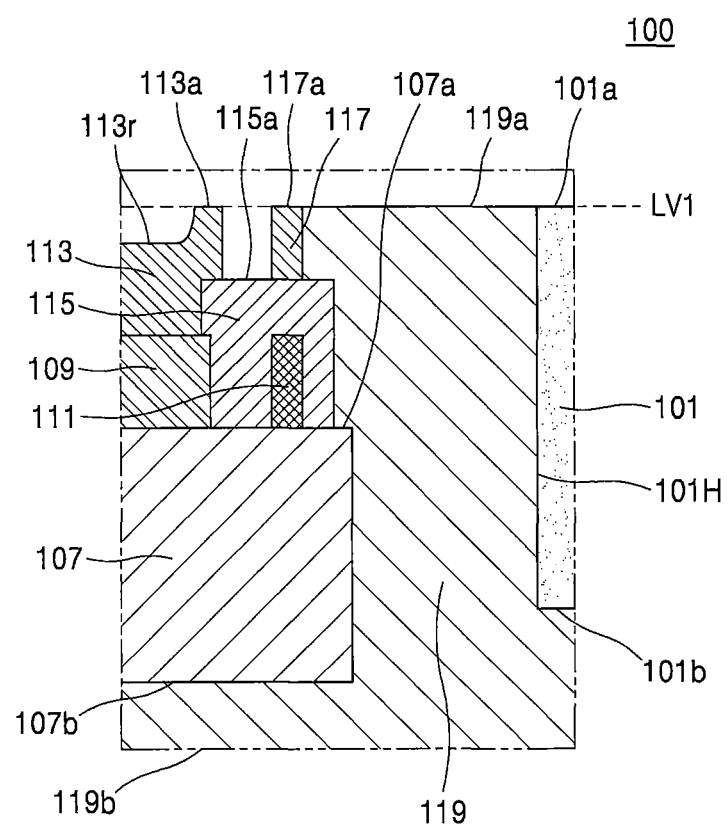
FIG. 3 is an enlarged view of region A of FIG. 2.

FIG. 1 is a plan view schematically illustrating a fan-out semiconductor package 100 according to an embodiment of the inventive concepts, FIG. 2 is a cross-sectional view of components of the fan-out semiconductor package 100 according to an embodiment of the inventive concepts, taken along a line II-IP of FIG. 1, and FIG. 3 is an enlarged view of region A of FIG. 2.

In detail, a fan-out semiconductor package 100 may include a fan-in area FI in which a semiconductor chip 118 is located, and a fan-out area FO at sides (e.g., opposite sides) of the semiconductor chip 118, as shown in FIG. 2.

The fan-out semiconductor package 100 may further include solder balls (not shown) electrically connected to the semiconductor chip 118 above or below the fan-out area FO. The fan-in area FI may correspond to a chip in area CHIA in which the semiconductor chip 118 is formed, as shown in FIG. 1. The fan-out area FO may correspond to a chip out area CHOA around the chip in area CHIA. The fan-out semiconductor package 100 may be a package having the shape of fan out panel level package (FOPLP).

The semiconductor chip 118 may include a plurality of individual devices (not shown). The plurality of individual devices may include a variety of microelectronics devices, for example, a metal-oxide-semiconductor field effect transistor (MOSFET), such as a complementary metal-insulator-semiconductor (CMOS) transistor, a system large scale integration (LSI), an image sensor such as a CMOS imaging sensor, a micro-electro-mechanical system (MEMS), an active device, a passive device, and the like.

The fan-out semiconductor package 100 may include a frame substrate 106 having a through hole 101H therein, the semiconductor chip 118 arranged on the through hole 101H, and an encapsulation layer 119 formed on side surfaces (e.g., opposite side surfaces) of the semiconductor chip 118 within the through hole 101H, as shown in FIG. 2. The frame substrate 106 may be a printed circuit board.

The frame substrate 106 may include a frame body 101 at sides (e.g., opposite sides) of the through hole 101H, and a multi-layer wiring structure 104 formed within the frame body 101. The frame body 101 may include at least one material from among phenol resin, epoxy resin, and polyimide. For example, the frame body 101 may include at least one material from among Frame Retardant 4 (FR4), tetra-functional epoxy, polyphenylene ether, epoxy/polyphenylene oxide, bismaleimide triazine (BT), thermount, cyanate ester, polyimide, and liquid crystal polymer.

The multi-layer wiring structure 104 may include a plurality of wiring layers 103 formed within the frame body 101, and a via 105 for connecting the plurality of wiring layers 103. The wiring layers 103 may include metal layers. For example, the wiring layers 103 may include electrolytically deposited (ED) copper foils, rolled-annealed (RA) copper foils, stainless steel foils, aluminum foils, ultra-thin copper foils, sputtered copper, or copper alloys. The via 105 may include, for example, copper, nickel, stainless steel, or beryllium copper.

The semiconductor chip 118 may include a chip body 107, a chip pad 109 formed on a surface (e.g., a top surface) of the chip body 107, a capping layer 113 formed on the chip pad 109, and a passivation layer 115 formed on the chip body 107 while surrounding the capping layer 113. The chip pad 109 and the capping layer 113 may be called a pad structure 114. It will be understood that "an element A surrounds an element B" (or similar language) as used herein means that the element A is at least partially around the element B but does not necessarily mean that the element A completely encloses the element B.

The chip body 107 may include a semiconductor material, for example, silicon (Si). The chip body 107 may include a semiconductor material, such as a semiconductor element, for example, germanium (Ge), or a compound semiconductor, such as silicon carbide (SiC), gallium arsenide (GaAs), indium arsenide (InAs), or indium phosphide (InP).

For convenience, two chip pads 109 are shown in FIG. 2. However, one or more than two chip pads 109 may be provided. The chip pad 109 may be a metal pad, such as an aluminum pad or copper pad. The chip pad 109 may be a conductive pad that is electrically conductive. The capping layer 113 may be a protective layer that protects the chip pad 109 and facilitates electrical connection between the chip pad 109 and a conductive layer (not shown). The capping layer 113 may be optionally formed. The capping layer 113 may be a metallic layer, for example, a copper layer. The capping layer 113 may be a conductive layer that is electrically conductive.

The capping layer 113 may be formed on surfaces of the semiconductor chip 118 (e.g., near sides of the semiconductor chip 118) within the through hole 101H. The encapsulation layer 119 may be formed between the frame substrate 106 and the semiconductor chip 118. The encapsulation layer 119 may be formed on the chip body 107 and on a bottom surface of the frame substrate 106. The encapsulation layer 119 may be formed on an edge portion of the chip body 107 and on an edge portion of the passivation layer 115. The encapsulation layer 119 may include epoxy molding compound (EMC), for example.

In some embodiments, the edge portion of the chip body 107 may include areas of the chip body 107 that are adjacent the outermost edge (e.g., an edge that is remote from the center of the chip body 107) of the chip body 107. The edge portion of the chip body 107 is not limited to the absolute edge of the chip body 107, but includes areas that are adjacent (e.g., near) the edge of the chip body 107. For example, the edge portion of the chip body 107 includes portions of the chip body that are closer to the outermost edge of the chip body 107 than the nearest chip pad 109 (e.g., between the chip pad 109 and the outermost edge of the chip body 107). The outermost edge of the chip body 107 may be located at a sidewall of the chip body 107.

The passivation layer 115 may be on and/or surround part of the capping layer 113 while being on and/or entirely surrounding sides of the chip pad 109. The passivation layer 115 may be an insulating layer, for example, a silicon nitride layer. The passivation layer 115 may be a protective layer formed on the outermost part of the semiconductor chip 118. The passivation layer 115 may be formed to expose the capping layer 113. When the capping layer 113 is not formed, the passivation layer 115 may be formed to expose the chip pad 109 while surrounding sides of the chip pad 109.

The fan-out semiconductor package 100 may further include a guard ring 117 formed on the passivation layer 115 above the edge portion of the chip body 107. The guard ring 117 may be a metallic guard ring, for example, a copper guard ring. The guard ring 117 may be formed in the same manufacturing operation as the capping layer 113.

The guard ring 117 may be formed while extending along a perimeter of the chip in area CHIA, as shown in FIG. 1. The guard ring 117 may be formed between the chip in area CHIA and the chip out area CHOA, as shown in FIG. 1. The guard ring 117 may be a continuous layer on and/or surrounding the edge portion of the chip body 107 in a plan view. In some embodiments, the guard ring 117 may extend along a perimeter of the chip body in a plan view. The guard ring 117 may be a dam structure formed as a single body in a plan view. The guard ring 117 may be in contact with a surface of the encapsulation layer 119. The guard ring 117 may prevent outflow or bleeding of the material forming the encapsulation layer 119 in a direction of the capping layer 113 on the chip pad 109 when the encapsulation layer 119 is formed.

Here, components of the fan-out semiconductor package 100 will be described in more detail with reference to FIG. 3.

More specifically, the chip body 107 may include a first surface 107a (e.g., a top surface) and a second surface 107b (e.g., a bottom surface). The frame body 101 that constitutes the frame substrate 106 may include a first surface 101a (e.g., a top surface) and a second surface 101b (e.g., a bottom surface). The second surface 107b of the chip body 107 may be at a lower level than the second surface 101b of the frame body 101 that constitutes the frame substrate 106.

The encapsulation layer 119 may include a first surface 119a (e.g. a top surface) and a second surface 119b (e.g., a bottom surface). The encapsulation layer 119 may be formed on the edge portion of the chip body 107 and on an edge portion of the passivation layer 115. A height of the guard ring 117 may be about 5 µm or less. The height of the guard ring 117 may be about 5 µm or less from a first surface 115a (e.g., a top surface) of the passivation layer 115. The first surface 117a of the guard ring 117 may be at the same level as (e.g., coplanar with) the first surface 119a of the encapsulation layer 119, as indicated by LV1. As indicated by LV1, the first surface 117a of the guard ring 117 may be at the same level as (e.g., coplanar with) a first surface 113a (e.g., a top surface) of the capping layer 113. The first surface 115a of the passivation layer 115 may be at a lower level than the first surface 119a of the encapsulation layer 119. The capping layer 113 may include a recess portion 113r recessed from the first surface 113a of a center portion of the capping layer 113.

In the fan-out semiconductor package 100, the first surface 119a of the encapsulation layer 119 and the first surface 117a of the guard ring 117 are formed at the same level so that outflow of the material forming the encapsulation layer 119 in the direction of the capping layer 113 does not occur when the encapsulation layer 119 is formed, thereby preventing package defects from occurring.

Furthermore, in the fan-out semiconductor package 100, a ring 111 for preventing and/or reducing cracks (e.g., a crack-reducing ring) may be further formed on the edge portion of the chip body 107 at sides of the chip pad 109. The ring 111 for preventing cracks may be formed so as to prevent and/or reduce cracks from propagating into the semiconductor chip 118 when a wafer is diced so as to make a plurality of semiconductor chips implemented on a wafer (not shown) into individual semiconductor chips 118. The ring 111 for preventing and/or reducing cracks may be formed as a metallic ring.

Figure 4:
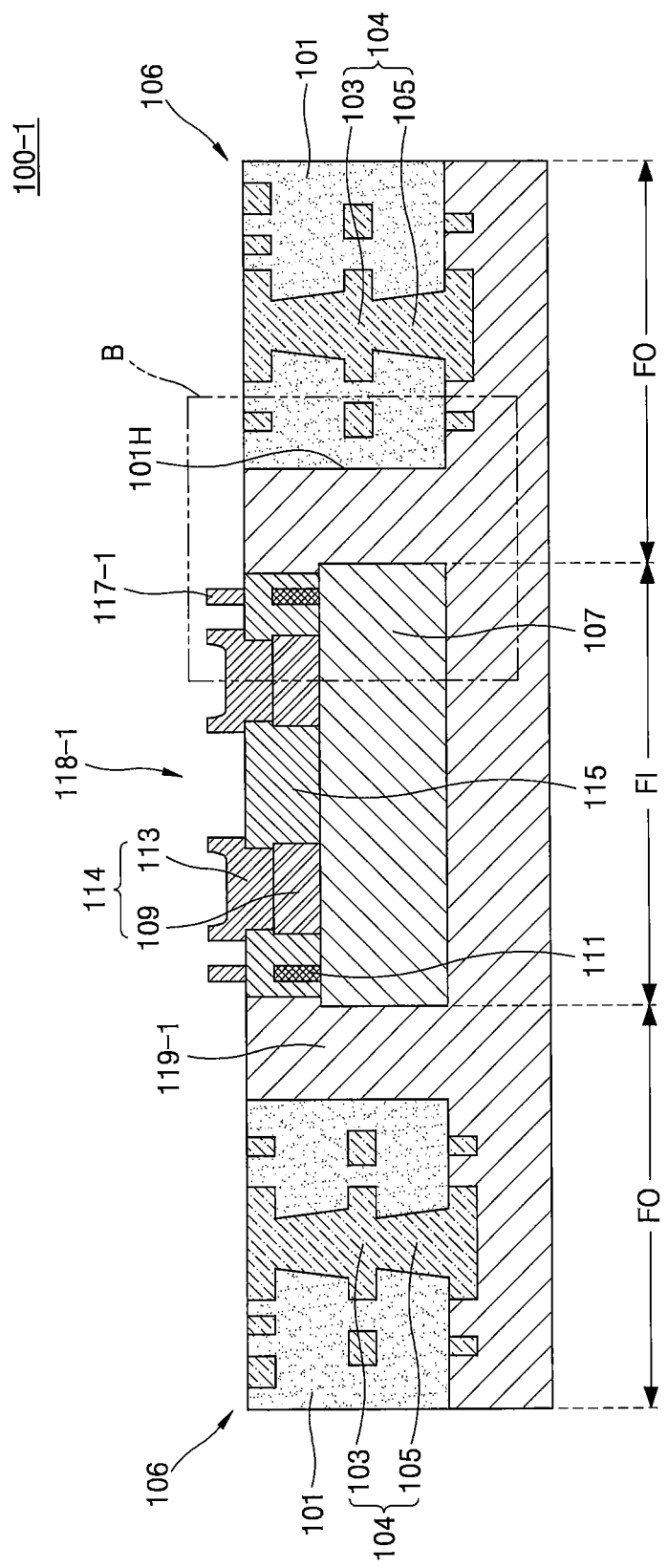
FIG. 4 is a cross-sectional view of components of a fan-out semiconductor package according to an embodiment of the inventive concepts.
Figure 5:
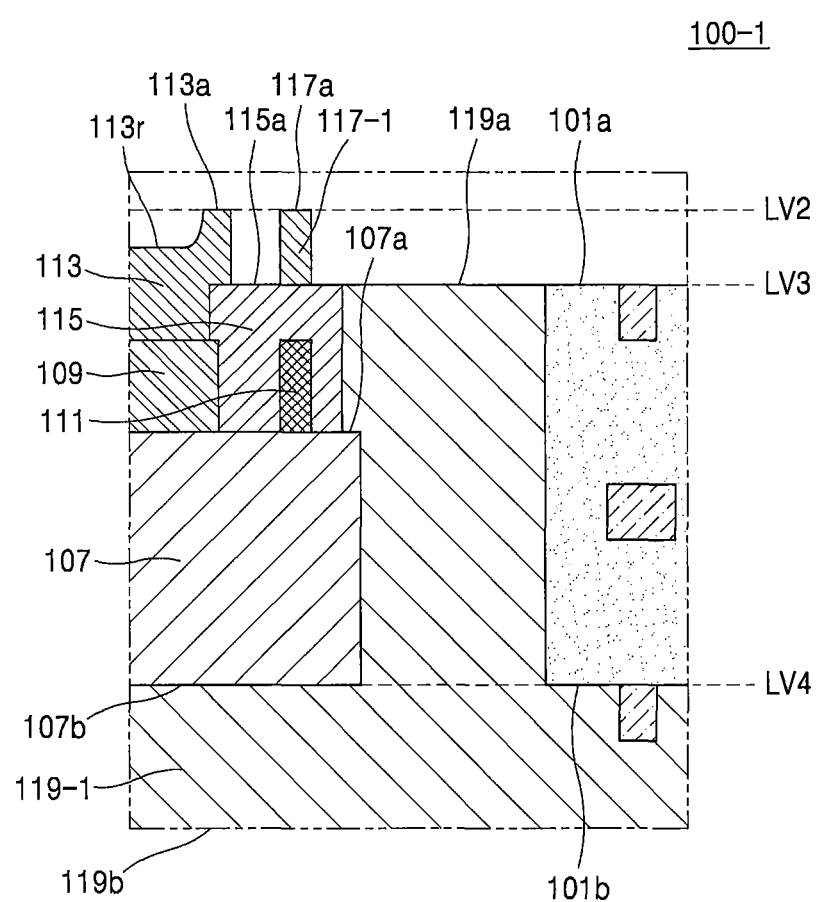
FIG. 5 is an enlarged view of region B of FIG. 4.

FIG. 4 is a cross-sectional view of components of a fan-out semiconductor package 100-1 according to an embodiment of the inventive concepts, and FIG. 5 is an enlarged view of region B of FIG. 4.

In detail, FIG. 4 may correspond to a cross-sectional view of a fan-out semiconductor package 100-1 taken along a line II-IP of FIG. 1. Comparing a fan-out semiconductor package 100-1 of FIGS. 4 and 5 to the fan-out semiconductor package 100 of FIGS. 2 and 3, the fan-out semiconductor package 100-1 of FIGS. 4 and 5 may be almost the same as the fan-out semiconductor package 100 of FIGS. 2 and 3 except for a relative position relationship between a semiconductor chip 118-1 and the frame substrate 106, a relative position relationship between a guard ring 117-1 and an encapsulation layer 119-1, and a relative position relationship between the guard ring 117-1 and the frame substrate 106. The descriptions of elements of FIGS. 4 and 5 that are substantially the same as those in FIGS. 2 and 3 are briefly given or omitted.

The fan-out semiconductor package 100-1 may include a frame substrate 106 having a through hole 101H therein, the semiconductor chip 118-1 arranged on the through hole 101H, and an encapsulation layer 119-1 formed on side surfaces of the semiconductor chip 118-1 within the through hole 101H, as shown in FIG. 4. The semiconductor chip 118-1 may include a chip body 107, a chip pad 109, a capping layer 113, and a passivation layer 115. The chip pad 109 and the capping layer 113 may be called a pad structure 114.

The encapsulation layer 119-1 may be formed on side surfaces of the semiconductor chip 118-1 within the through hole 101H. The encapsulation layer 119-1 may be formed between a frame substrate 106 and the semiconductor chip 118-1. The encapsulation layer 119-1 may be formed on the chip body 107 and on a bottom surface of the frame substrate 106. The encapsulation layer 119-1 may be formed on an edge portion of the chip body 107.

The passivation layer 115 may be on and/or surround part of the capping layer 113 while being on and/or entirely surrounding sides of the chip pad 109. The passivation layer 115 may be formed to expose the capping layer 113. When the capping layer 113 is not formed, the passivation layer 115 may be formed to expose the chip pad 109 while surrounding sides of the chip pad 109.

The fan-out semiconductor package 100-1 may include the guard ring 117-1 formed on and, in some embodiments contacting, the passivation layer 115 above the edge portion of the chip body 107. The guard ring 117-1 may be a metallic guard ring, for example, a copper guard ring. The guard ring 117-1 may be formed in the same manufacturing operation as the capping layer 113.

The guard ring 117-1 may be a continuous layer on and/or surrounding the edge portion of the chip body 107 in a plan view. The guard ring 117-1 may be a dam structure formed as a single body in a plan view. The guard ring 117-1 may reduce and/or prevent outflow of the material forming the encapsulation layer 119-1 in a direction of the capping layer 113 on the chip pad 109 when the encapsulation layer 119-1 is formed.

Here, components of the fan-out semiconductor package 100-1 will be described in more detail with reference to FIG. 5.

More specifically, the second surface 107b (e.g., bottom surface) of the chip body 107 may be at the same level as the second surface 101b (e.g., bottom surface) of the frame body 101 that constitutes the frame substrate 106. The encapsulation layer 119-1 may be formed above the edge portion of the chip body 107. The encapsulation layer 119-1 may be in contact with the edge portion of the passivation layer 115.

As indicated by LV2, the first surface 117a (e.g., top surface) of the guard ring 117-1 may be at a higher level than the first surface 119a (e.g., top surface) of the encapsulation layer 119-1. As indicated by LV2, the first surface 117a of the guard ring 117-1 may be at the same level as the first surface 113a of the capping layer 113. As indicated by LV3, the first surface 115a of the passivation layer 115 may be at the same level as the first surface 119a of the encapsulation layer 119-1. As indicated by LV4, the second surface 107b of the chip body 107 may be at the same level as the second surface 101b of the frame body 101.

In the fan-out semiconductor package 100-1, even when the first surface 117a of the guard ring 117-1 is formed at a higher level than the first surface 119a of the encapsulation layer 119-1, outflow of the material forming the encapsulation layer 119-1 in the direction of the capping layer 113 does not occur when the encapsulation layer 119-1 is formed, thereby reducing and/or preventing package defects from occurring.

FIGS. 6 through 9 are cross-sectional views of components for describing a method of manufacturing the fan-out semiconductor package 100 of FIGS. 2 and 3, according to an embodiment of the inventive concepts.

Figure 6:
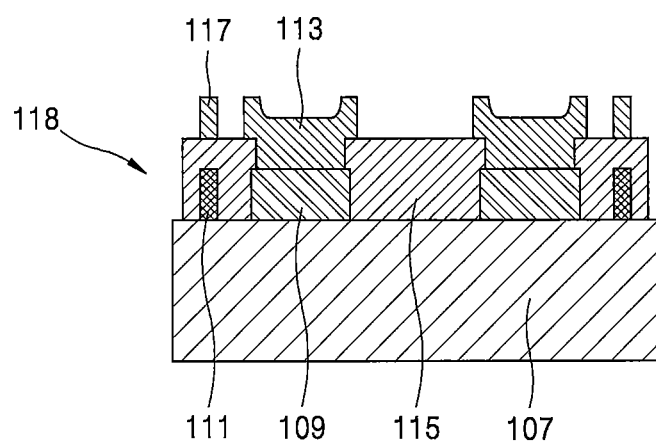
FIGS. 6 through 9 are cross-sectional views of components for describing a method of manufacturing the fan-out semiconductor package of FIGS. 2 and 3, according to an embodiment of the inventive concepts.

Referring to FIG. 6, the semiconductor chip 118 is prepared using a wafer process (wafer-manufacturing process). The wafer process may be a process of manufacturing the semiconductor chip 118 including electronic devices, such as transistors, by performing a diffusion process, a thin layer-forming process, an ion implantation process, and a photolithographic process on a wafer. A plurality of semiconductor chips may be manufactured on the wafer. The semiconductor chip 118 shown in FIG. 6 may be manufactured through a dicing process of cutting the wafer into individual semiconductor chip units.

The semiconductor chip 118 may include the chip body 107, the chip pad 109 formed on the surface (e.g., a top surface) of the chip body 107, the capping layer 113 formed on the chip pad 109, and the passivation layer 115 formed on the chip body 107 while being on and/or surrounding sides of the chip pad 109 and the capping layer 113, as described above. The guard ring 117 may be formed on an edge portion of the passivation layer 115. The guard ring 117 may be formed above the edge portion of the chip body 107. The capping layer 113 and the guard ring 117 may be formed in the same manufacturing process as when the wafer process is performed.

Figure 7:
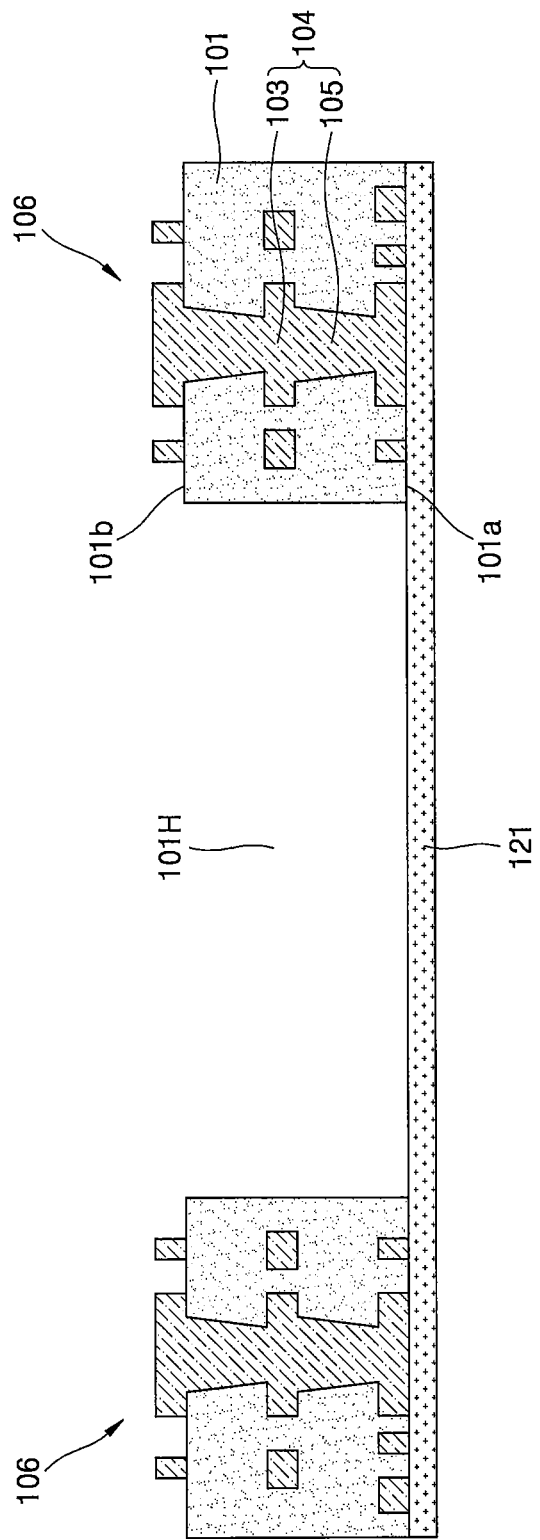

Referring to FIG. 7, the frame substrate 106 having the through hole 101H therein is prepared. The frame substrate 106 may include the frame body 101 located at sides (e.g., opposite sides) of the through hole 101H, and a multi-layer wiring structure 104 formed within the frame body 101. In some embodiments, the frame body 101 may have a first surface 101a and a second surface 101b. The multi-layer wiring structure 104 may include a plurality of wiring layers 103 formed within the frame body 101, and a via 105 for connecting the plurality of wiring layers 103.

Subsequently, the frame substrate 106, in which the through hole 101H is formed, may be attached to a tape substrate 121. The frame substrate 106 may be attached to the tape substrate 121 so that a wiring layer 103 (e.g., a wiring layer 103 that is closest to the first surface 101a of the frame body 101) may be attached to the tape substrate 121. In this way, the through hole 101H may be disposed in the center of the tape substrate 121, and the frame body 101 may be located at both sides of the tape substrate 121. In some embodiments, the frame substrate 106 may be attached to the tape substrate 121 so that the first surface 101a of the frame body 101 contacts the tape substrate 121. In some embodiments, the first surface 101a may be oriented downwards (e.g., below the second surface 101b in FIG. 7) so that it is reversed in orientation from that illustrated in FIGS. 2 and 3 (e.g., top-down).

Figure 8:
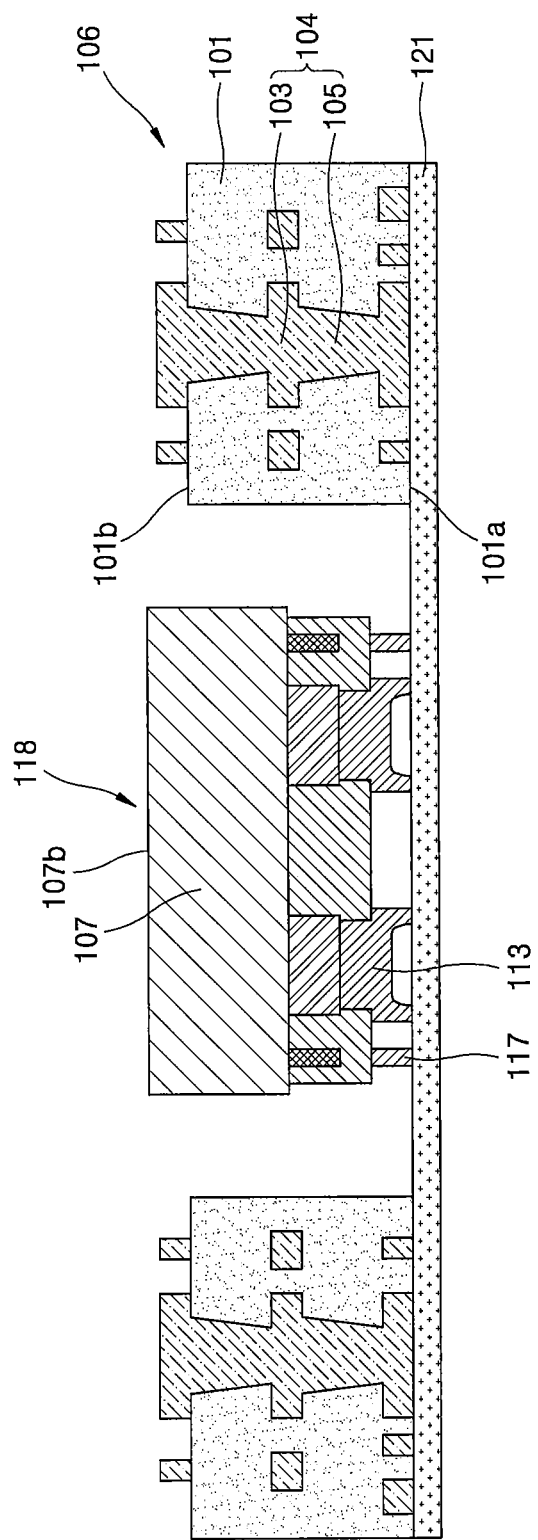

Referring to FIG. 8, the semiconductor chip 118 may be attached to the tape substrate 121 with the guard ring 117 and the capping layer 113 facing down in the through hole 101H of the frame substrate 106. The semiconductor chip 118 may be attached to the tape substrate 121 with an active surface, i.e., a top surface on which the capping layer 113 is formed, facing down.

In this way, the capping layer 113 of the semiconductor chip 118 and the guard ring 117 may be attached to the tape substrate 121, and one surface, i.e., the second surface 107b (e.g., the bottom surface in FIG. 6) of the chip body 107, faces up. The second surface 107b of the chip body 107 may be at a higher level than the second surface 101b of the frame body 101.

When the semiconductor chip 118 is attached to the tape substrate 121, the semiconductor chip 118 may be apart and/or remote from a side surface of the frame substrate 106. When the semiconductor chip 118 is apart and/or remote from the frame substrate 106, a surface of the tape substrate 121 may be exposed.

Figure 9:
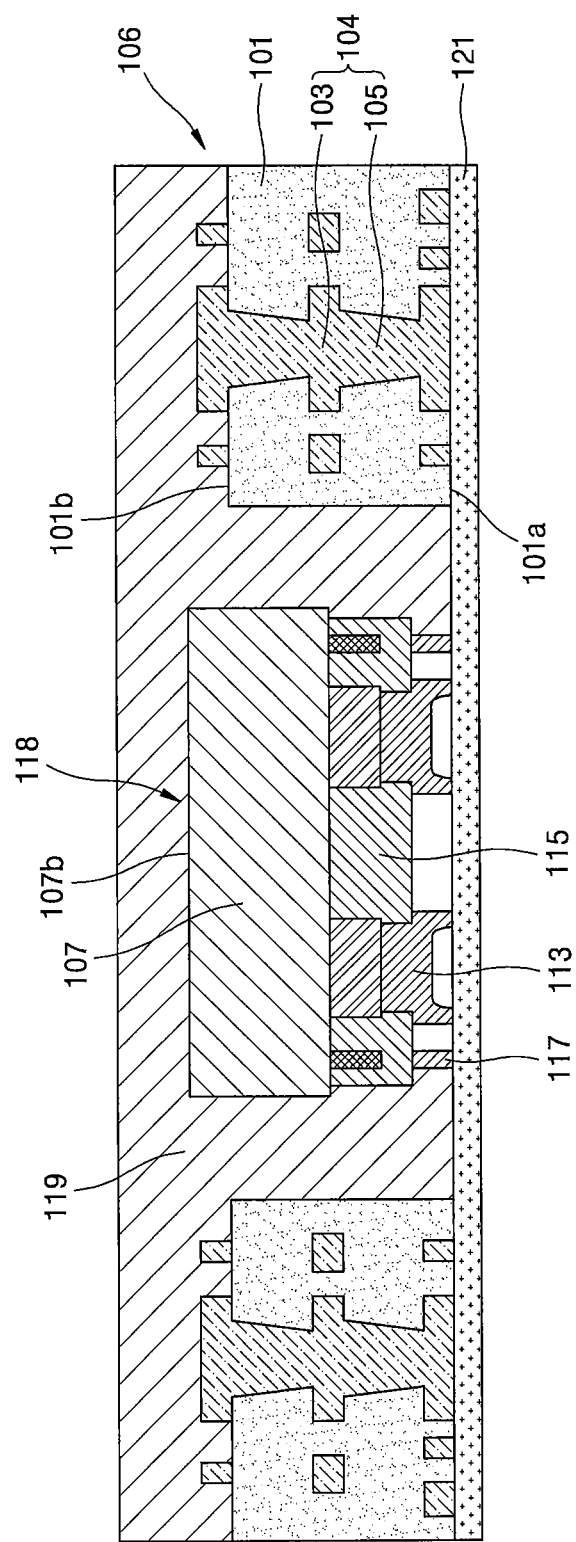

Referring to FIG. 9, an encapsulation layer 119 may be formed on the tape substrate 121 so as to be on and/or seal the semiconductor chip 118 and the frame substrate 106. The encapsulation layer 119 may be thickly formed so as to sufficiently seal the semiconductor chip 118 and the frame substrate 106. The encapsulation layer 119 may be formed thicker than the frame body 101 (e.g., so that the encapsulation layer 119 is on the second surface 101b of the frame body 101) and thicker than the chip body 107 (e.g., so that the encapsulation layer 119 is on the second surface 107b of the chip body 107).

Because, when the encapsulation layer 119 is formed, the guard ring 117 formed on the passivation layer 115 is attached to the tape substrate 121, outflow of the material forming the encapsulation layer 119 may not occur in the direction of the capping layer 113. In other words, when the encapsulation layer 119 is formed, the guard ring 117 prevents and/or reduces outflow over a part (e.g., a part of the capping layer 113 adjacent the tape substrate 121) of the capping layer 113 or between the capping layers 113 so that package defects may be reduced and/or prevented from occurring. Subsequently, when the tape substrate 121 is removed, the fan-out semiconductor package 100 shown in FIGS. 2 and 3 may be manufactured.

Figure 10:
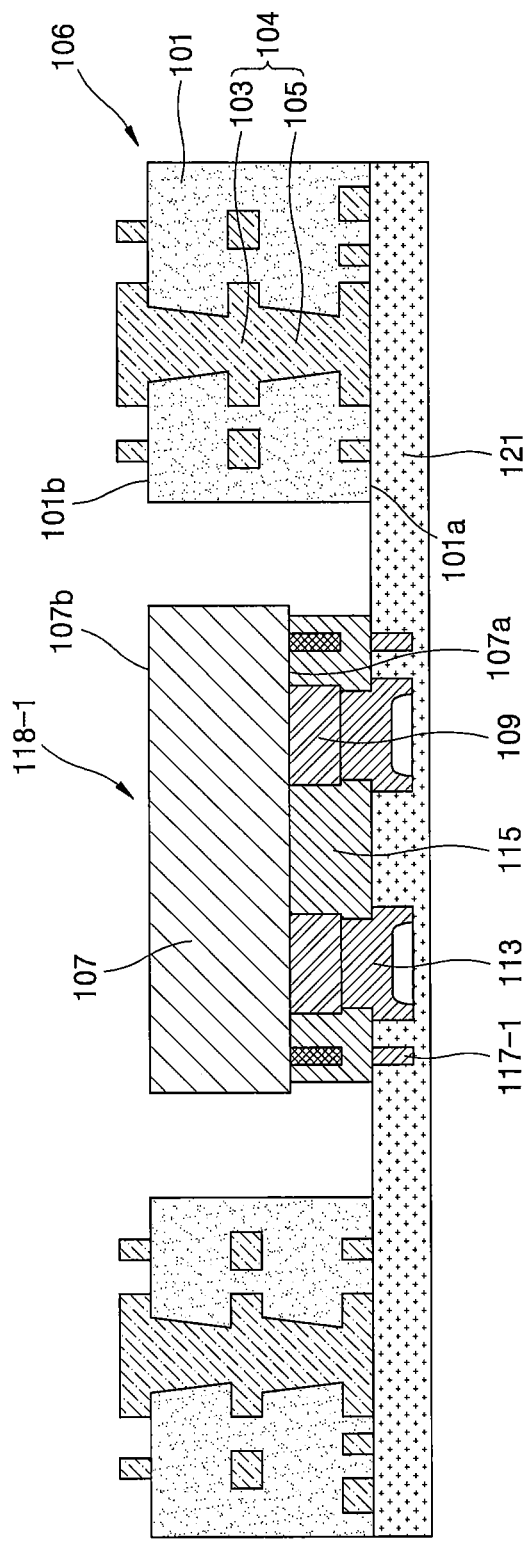
FIGS. 10 and 11 are cross-sectional views of components for describing a method of manufacturing the fan-out semiconductor package of FIGS. 4 and 5, according to an embodiment of the inventive concepts.
Figure 11:
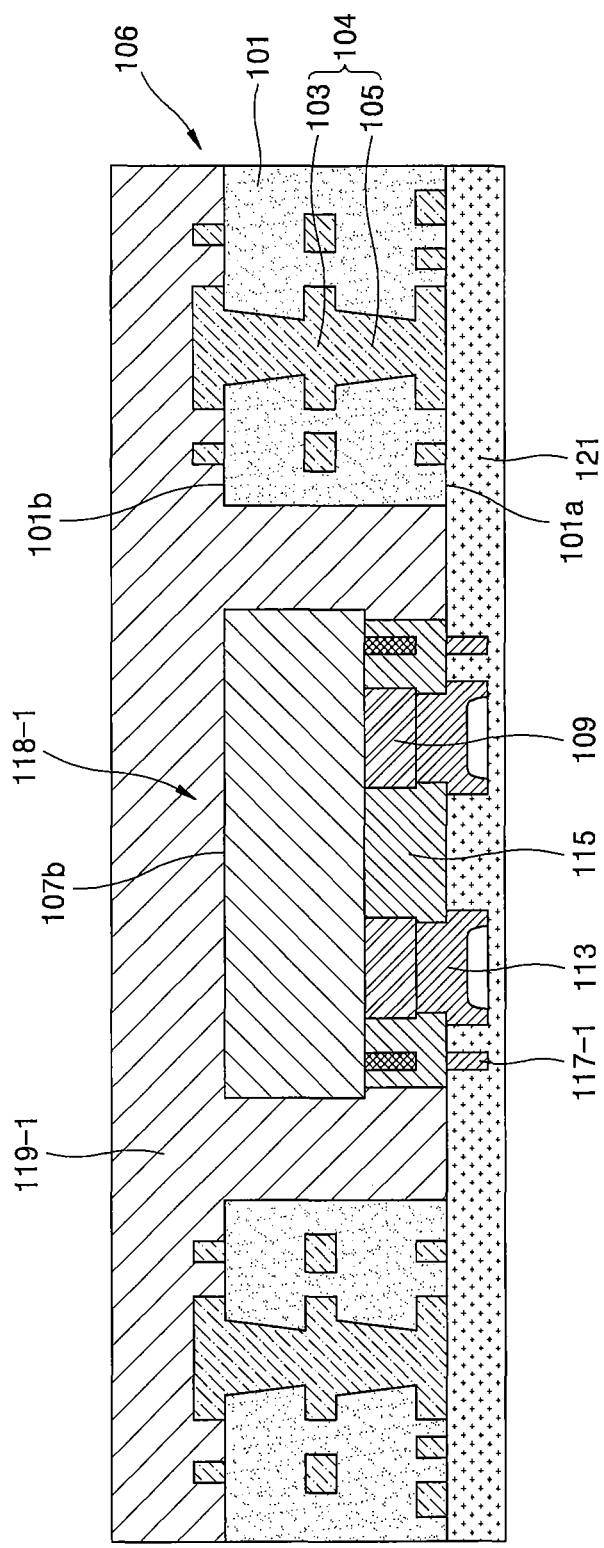

FIGS. 10 and 11 are cross-sectional views of components for describing a method of manufacturing the fan-out semiconductor package of FIGS. 4 and 5, according to an embodiment of the inventive concepts.

In detail, the manufacturing process of FIGS. 6 and 7 described above is performed. Reference numerals of some components are changed, such as a semiconductor chip 118-1, to be distinguished from the semiconductor chip 118 of FIGS. 2 and 3. The semiconductor chip 118-1 may include a chip body 107, a chip pad 109 formed on a surface (e.g., a top surface) of the chip body 107, a capping layer 113 formed on the chip pad 109, and a passivation layer 115 formed on the chip body 107 while being one and/or surrounding sides of the chip pad 109 and the capping layer 113.

A guard ring 117-1 may be formed on an edge portion of the passivation layer 115. The guard ring 117-1 may be formed above (e.g., on the first surface 107a of the chip body 107) the edge portion of the chip body 107. The capping layer 113 and the guard ring 117-1 may be formed in the same manufacturing process as when a wafer process is performed.

Referring to FIG. 10, the semiconductor chip 118-1 may be attached to the tape substrate 121 with the guard ring 117-1 and the capping layer 113 within the through hole 101H of the frame substrate 106 facing down. The semiconductor chip 118-1 may be attached to the tape substrate 121 with an active surface, i.e., a first surface 107a (e.g., a top surface) of the chip body 107 on which the capping layer 113 and the guard ring 117-1 are formed, facing down.

When the semiconductor chip 118-1 is attached to the tape substrate 121, the capping layer 113 and the guard ring 117-1 may penetrate into the tape substrate 121, and the passivation layer 115 may be near and/or in contact with the tape substrate 121 so that adhesion between the semiconductor chip 118-1 and the tape substrate 121 may be enhanced. In this way, the capping layer 113 of the semiconductor chip 118-1 and the guard ring 117-1 may penetrate into the tape substrate 121 and may be attached thereto, and a surface, i.e., the second surface 107b (e.g., the bottom surface in FIG. 6) of the chip body 107 may face up. The second surface 107b of the chip body 107 may be at the same level as the second surface 101b of the frame body 101.

When the semiconductor chip 118-1 is attached to the tape substrate 121, the semiconductor chip 118-1 may be apart and/or remote from a side surface of the frame substrate 106. When the semiconductor chip 118-1 is apart and/or remote from the frame substrate 106, a surface of the tape substrate 121 may be exposed.

Referring to FIG. 11, an encapsulation layer 119-1 for sealing the semiconductor chip 118-1 and the frame substrate 106 may be formed on the tape substrate 121. The encapsulation layer 119-1 may be thickly formed so as to be on and/or sufficiently seal the semiconductor chip 118-1 and the frame substrate 106. The encapsulation layer 119-1 may be formed thicker than the frame body 101 (e.g., so that the encapsulation layer 119-1 is on the second surface 101b of the frame body 101) and thicker than the chip body 107 (e.g., so that the encapsulation layer 119-1 is on the second surface 107b of the chip body 107).

Because, when the encapsulation layer 119-1 is formed, the passivation layer 115 is attached to the tape substrate 121 and the guard ring 117-1 penetrates into the tape substrate 121, the material forming the encapsulation layer 119-1 may not outflow in the direction of the capping layer 113. In other words, when the encapsulation layer 119-1 is formed, the guard ring 117-1 may not allow outflow over a part (e.g., a part of the capping layer 113 adjacent the tape substrate 121) of the capping layer 113 or between the capping layers 113 so that package defects may be reduced and/or prevented from occurring. Subsequently, when the tape substrate 121 is removed, the fan-out semiconductor package 100-1 shown in FIGS. 4 and 5 may be manufactured.

Hereinafter, the structure of a fan-out semiconductor package according to various embodiments based on the fan-out semiconductor packages 100 and 100-1 described above will be described.

Figure 12:
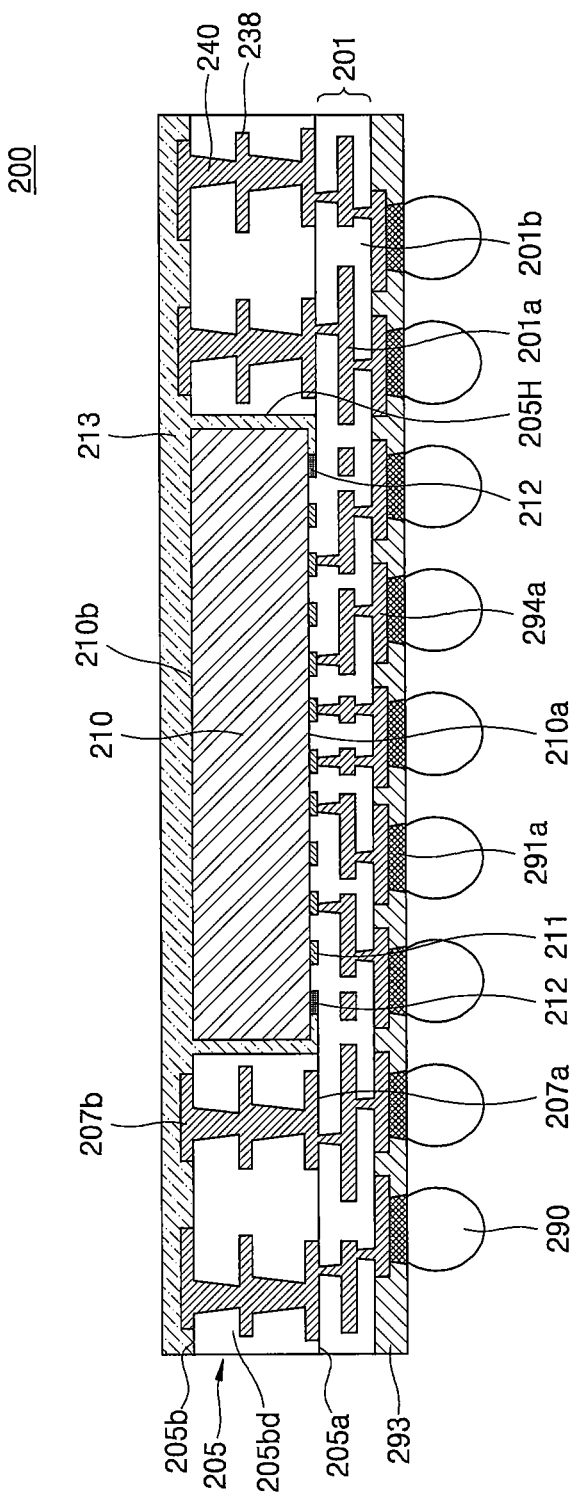
FIG. 12 is a cross-sectional view of components of a fan-out semiconductor package according to an embodiment of the inventive concepts.

FIG. 12 is a cross-sectional view of components of a fan-out semiconductor package 200 according to an embodiment of the inventive concepts.

In detail, a fan-out semiconductor package 200 may include a frame substrate 205, a semiconductor chip 210, an encapsulation layer 213, and a guard ring 212. The fan-out semiconductor package 200 may be a panel level package including the frame substrate 205.

The frame substrate 205 may correspond to the frame substrate 106 of FIGS. 2 through 5. The semiconductor chip 210 may correspond to the semiconductor chip 118 and 118-1 of FIGS. 1 through 5. The encapsulation layer 213 may correspond to the encapsulation layers 119 and 119-1 of FIGS. 1 through 5. A guard ring 212 may correspond to the guard ring 117 and 117-1 of FIGS. 1 through 5.

The same descriptions of FIG. 12 as those of FIGS. 1 through 5 given above are briefly provided or omitted. The fan-out semiconductor package 200 may not be provided to describe all components, and some of the components are omitted so as to describe the inventive concepts. For example, a passivation layer in the semiconductor chip 210 is not illustrated for convenience.

The fan-out semiconductor package 200 may include a lower re-wiring structure 201 formed outside the semiconductor chip 210. The semiconductor chip 210 may be embedded in the frame substrate 205. The semiconductor chip 210 may have an active surface 210a (a first surface or a top surface) and an inactive surface 210b (see FIG. 14) (a second surface or a bottom surface) opposite to the active surface 210a.

The semiconductor chip 210 may include a pad structure 211 arranged in and/or on the active surface 210a. The pad structure 211 may correspond to the pad structure 114 of FIGS. 2 through 5. The pad structure 211 may include a chip pad and a capping layer. The pad structure 211 may be electrically connected to an individual element included in the semiconductor chip 210. In some embodiments, the semiconductor chip 210 may include a central processor unit (CPU), a micro processor unit (MPU), a graphics processor unit (GPU), or an application processor (AP).

The frame substrate 205 may be a multi-layer printed circuit board on which a plurality of wiring layers 238 are stacked. The plurality of wiring layers 238 may be electrically connected to one another. The frame substrate 205 may include a frame body 205bd. The frame body 205bd may correspond to the frame body 101 of FIGS. 2 through 5.

A first connection pad 207a and a second connection pad 207b may be arranged with respect to a first surface 205a (a bottom surface) and a second surface 205b (a top surface) of the frame substrate 205, respectively. A multi-layer wiring structure including a wiring layer 238 for connecting the first connection pad 207a and the second connection pad 207b and a via 240 formed through the frame body 205bd, may be formed within the frame substrate 205.

The first connection pad 207a, the second connection pad 207b, and the wiring layer 238 may be metal layers. The frame substrate 205 may have a through hole 205H formed through the frame body 205bd. The semiconductor chip 210 may be arranged within the through hole 205H of the frame substrate 205. A horizontal cross-sectional area of the through hole 205H may be greater than a horizontal cross-sectional area of the semiconductor chip 210. The depth of the through hole 205H, i.e., the thickness of the frame substrate 205, may be greater than or equal to the thickness of the semiconductor chip 210.

The semiconductor chip 210 may be arranged within the through hole 205H so as to be apart from an inner side surface of the through hole 205H of the frame substrate 205. Thus, an encapsulation layer 213 may be formed on the second surface 205b of the semiconductor chip 210 while surrounding the semiconductor chip 210. The encapsulation layer 213 may also be formed on the second surface 205b of the frame substrate 205. The second connection pad 207b may be covered by the encapsulation layer 213.

In the fan-out semiconductor package 200, the encapsulation layer 213 may not be formed on portions of the active surface 210a (first surface) of the semiconductor chip 210 due to a guard ring 212 in a process of manufacturing the encapsulation layer 213 so that the possibility of package defects may be reduced. The pad structure 211 of the semiconductor chip 210 and the first connection pad 207a of the frame substrate 205 may be at substantially the same level. The lower re-wiring structure 201 may be arranged on the active surface 210a of the semiconductor chip 210 and the first surface 205a of the frame substrate 205. The lower re-wiring structure 201 may include a plurality of layers.

The lower re-wiring structure 201 may include a lower re-wiring layer 201a and a lower re-wiring insulating layer 201b. The lower re-wiring layer 201a may have a multi-layer structure in which a plurality of re-wiring patterns or wiring layers are stacked. The lower re-wiring insulating layer 201b may have a multi-layer structure in which a plurality of insulating layers are stacked. The lower re-wiring layer 201a may include a metal layer including copper, nickel, stainless steel, or beryllium copper, for example.

A first cover layer 293 may be formed on the lower re-wiring structure 201. The first cover layer 293 may be formed so as to protect the lower re-wiring structure 201. The first cover layer 293 may expose part of a lower re-wiring pad portion 294a connected to the lower re-wiring layer 201a. The first cover layer 293 may include a hydrocarbon cyclic compound containing a filler, for example. The filler may be a silicon dioxide ($SiO_2$) filler, for example. The first cover layer 293 may include an Ajinomoto Build-up Film (ABF), for example.

A first external connection pad 291a may be formed on the lower re-wiring pad portion 294a exposed by the first cover layer 293. As the first cover layer 293 is formed, the first external connection pad 291a may be finely formed. The thickness of the first cover layer 293 may be greater than the lower re-wiring pad portion 294a and the first external connection pad 291a.

An external connection terminal 290 may be attached to the first external connection pad 291a. The external connection terminal 290 may be a solder ball or bump, for example. The external connection terminal 290 may electrically connect between the fan-out semiconductor package 200 and an external device.

Figure 13:
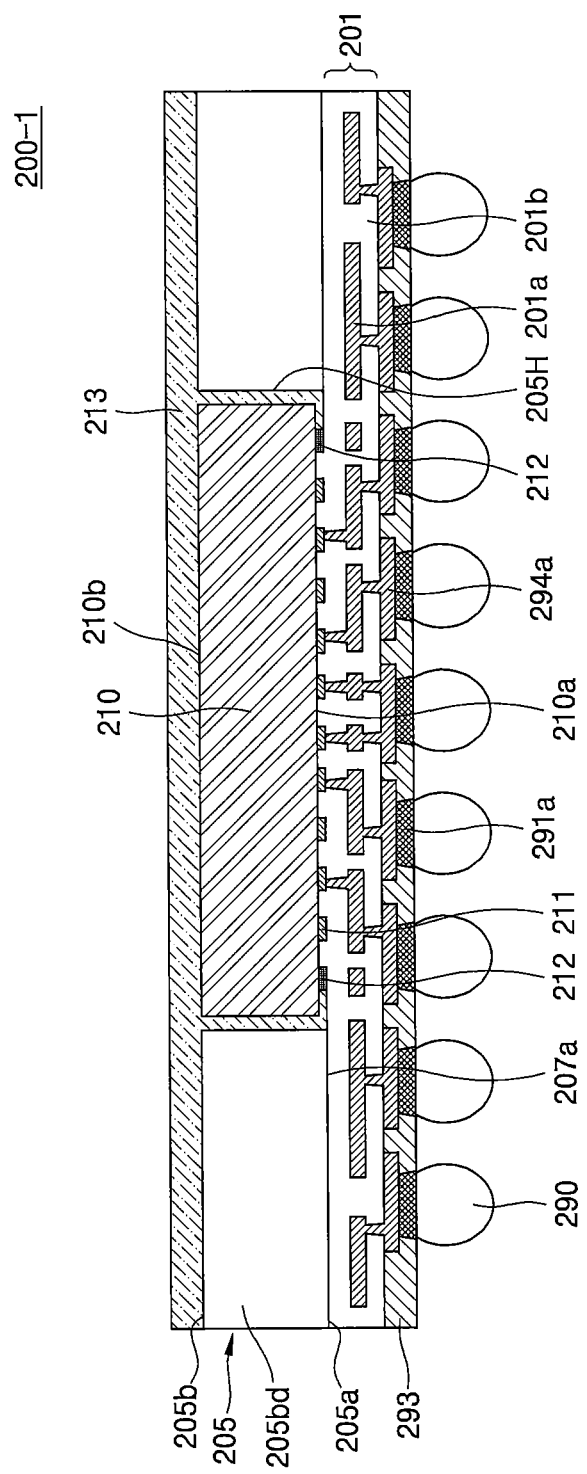
FIG. 13 is a cross-sectional view of components of a fan-out semiconductor package according to an embodiment of the inventive concepts.

FIG. 13 is a cross-sectional view of components of a fan-out semiconductor package 200-1 according to an embodiment of the inventive concepts.

In detail, when comparing a fan-out semiconductor package 200-1 with the fan-out semiconductor package 200, the fan-out semiconductor package 200-1 may be the same as the fan-out semiconductor package 200 of FIG. 12 except for no wiring layer, no via and no connection pad may be formed within the frame body 205bd. The same reference numerals of FIG. 13 as those of FIG. 12 are briefly given or omitted.

The fan-out semiconductor package 200-1 may include a frame substrate 205, a semiconductor chip 210, an encapsulation layer 213, and a guard ring 212. No wiring layer, no via, and no connection pad may be arranged within the frame body 205bd that constitutes the frame substrate 205.

In the fan-out semiconductor package 200-1, the encapsulation layer 213 may be formed on the second surface 205b of the semiconductor chip 210 while being on and/or surrounding the semiconductor chip 210 within the through hole 205H. The encapsulation layer 213 may also be formed on the second surface 205b of the frame substrate 205. Due to the guard ring 212, the encapsulation layer 213 may not be formed on portions of the active surface 210a (first surface) of the semiconductor chip 210.

In the fan-out semiconductor package 200-1, a lower re-wiring structure 201 may be arranged on the active surface 210a of the semiconductor chip 210 and the first surface 205a of the frame substrate 205. The lower re-wiring structure 201 may include a lower re-wiring layer 201a and a lower re-wiring insulating layer 201b. A first cover layer 293 may be formed under the lower re-wiring structure 201.

A first external connection pad 291a may be formed on a lower re-wiring pad portion 294a exposed by the first cover layer 293. An external connection terminal 290 may be attached to the first external connection pad 291a. The external connection terminal 290 may electrically connect between the fan-out semiconductor package 200-1 and an external device.

Figure 14:
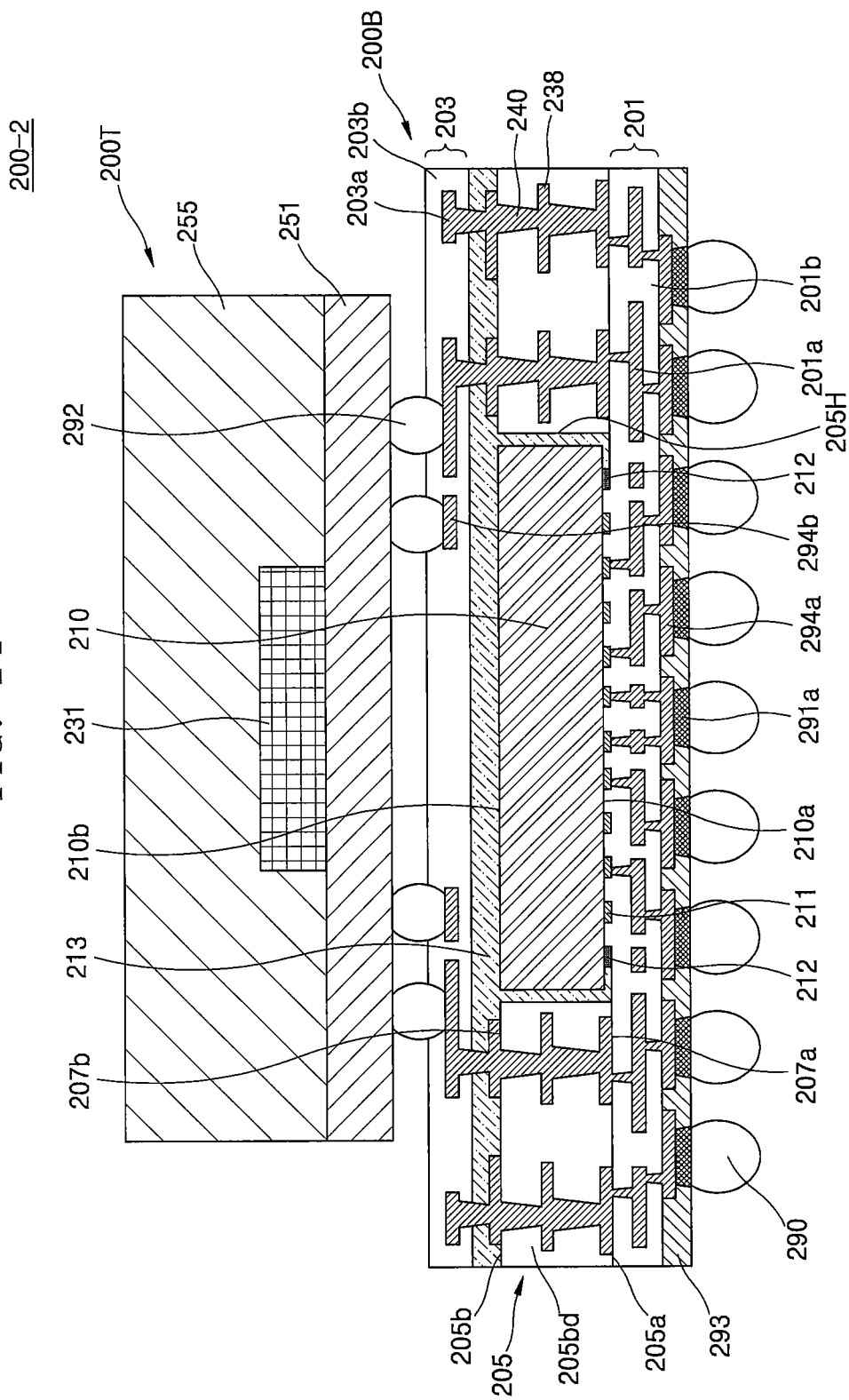
FIG. 14 is a cross-sectional view of components of a fan-out semiconductor package according to an embodiment of the inventive concepts.

FIG. 14 is a cross-sectional view of components of a fan-out semiconductor package 200-2 according to an embodiment of the inventive concepts.

In detail, when comparing a fan-out semiconductor package 200-2 with the fan-out semiconductor package 200 of FIG. 12, the fan-out semiconductor package 200-2 may be the same as the fan-out semiconductor package 200 of FIG. 12 except for an upper re-wiring structure 203 further formed on the frame substrate 205 and the semiconductor chip 210 (which may now be referred to as a lower semiconductor chip 210) and the fan-out semiconductor package 200-2 being a stack package on which an upper package 200T is stacked on the upper re-wiring structure 203. The same reference numerals of FIG. 14 as those of FIG. 12 are briefly given or omitted.

The fan-out semiconductor package 200-2 may be a stack package including a lower package 200B and the upper package 200T. In the lower package 200B, a lower re-wiring structure 201 and an upper re-wiring structure 203 may be formed outside the lower semiconductor chip 210.

An upper re-wiring structure 203 may be arranged on the frame substrate 205 and the encapsulation layer 213 on the lower semiconductor chip 210. The upper re-wiring structure 203 may include a plurality of layers. The upper re-wiring structure 203 may include an upper re-wiring layer 203a and an upper re-wiring insulating layer 203b. The upper re-wiring layer 203a may be wiring patterns horizontally connected to each other. The upper re-wiring layer 203a may be formed through the encapsulation layer 213 and connected to the second connection pad 207b.

A package connection terminal 292 may be directly connected to an upper re-wiring pad portion 294b of the upper re-wiring structure 203. The upper re-wiring pad portion 294b may be formed on part of the upper re-wiring layer 203a. The package connection terminal 292 may be a solder ball or bump, for example. The package connection terminal 292 may electrically connect between the lower package 200B and the upper package 200T. The upper package 200T may be attached to the lower package 200B with the package connection terminal 292 therebetween.

The upper package 200T may include an upper semiconductor chip 231 attached to an upper package substrate 251. The upper package substrate 251 and the upper semiconductor chip 231 may be electrically connected to each other via a bonding wire or bump. In FIG. 14, the upper semiconductor chip 231 may be connected to the upper package substrate 251 using a bump (not shown).

The upper semiconductor chip 231 may be a memory semiconductor chip, for example. The memory semiconductor chip may include a volatile memory semiconductor chip, such as dynamic random access memory (DRAM) or static random access memory (SRAM), or a non-volatile memory semiconductor chip, such as phase-change random access memory (PRAM), magnetoresistive random access memory (MRAM), ferroelectric random access memory (FeRAM), or resistive random access memory (RRAM).

The upper semiconductor chip 231 may be one semiconductor chip. However, embodiments are not limited thereto. For example, the upper semiconductor chip 231 may include a plurality of memory semiconductor chips. In some embodiments, the upper package 200T may further include a controller chip for controlling the upper semiconductor chip 231.

The upper package 200T may include an upper encapsulation layer 255 surrounding at least part of the upper semiconductor chip 231. The upper encapsulation layer 255 may include an epoxy molding compound (EMC), for example. The upper encapsulation layer 255 may be on and/or cover the inactive surface (top surface of the upper semiconductor chip 231) of the upper semiconductor chip 231. However, embodiments are not limited thereto.

Figure 15:
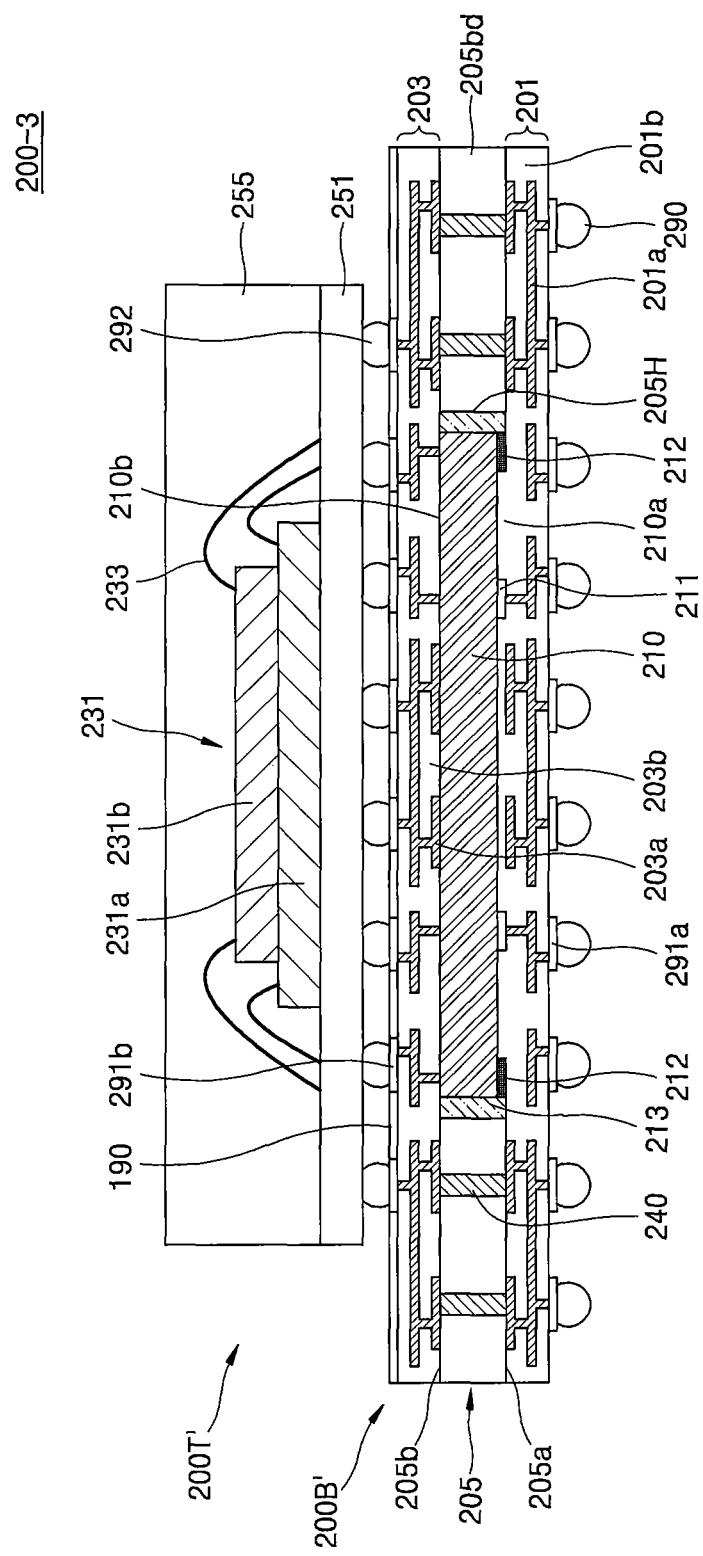
FIG. 15 is a cross-sectional view of components of a fan-out semiconductor package according to an embodiment of the inventive concepts.

FIG. 15 is a cross-sectional view of components of a fan-out semiconductor package 200-3 according to an embodiment of the inventive concepts.

In detail, when comparing the fan-out semiconductor package 200-3 with the fan-out semiconductor package 200-2 of FIG. 14, the fan-out semiconductor package 200-3 may be the same as the fan-out semiconductor package 200-2 of FIG. 14 except there may be no encapsulation layer formed on the inactive surface 210b of the lower semiconductor chip 210 and the fan-out semiconductor package 200-3 being a stack package on which an upper package Nor including a plurality of upper semiconductor chips 231 is stacked on an upper re-wiring structure 203. The same reference numerals of FIG. 15 as those of FIG. 14 are briefly given or omitted.

The fan-out semiconductor package 200-3 may be a stack package including a lower package 200B' and the upper package 200T'. The lower package 200B' may include a lower semiconductor chip 210 embedded in the frame substrate 205. The lower semiconductor chip 210 may include a pad structure 211 arranged on an active surface 210a. A via 240 formed through a frame body 205bd may be formed within the frame substrate 205. A lower re-wiring structure 201 may be arranged on the active surface 210a of the lower semiconductor chip 210 and a first surface 205a of the frame substrate 205. The lower re-wiring structure 201 may include a lower re-wiring layer 201a and a lower re-wiring insulating layer 201b.

A first cover layer may not be formed under the lower re-wiring structure 201, but a first external connection pad 291a may be formed directly on the lower re-wiring structure 201. The first external connection pad 291a may be connected to the lower re-wiring layer 201a. An external connection terminal 290 may be attached to the first external connection pad 291a.

An upper re-wiring structure 203 may be arranged on the frame substrate 205 and the lower semiconductor chip 210. The upper re-wiring structure 203 may include an upper re-wiring layer 203a and an upper re-wiring insulating layer 203b. A second cover layer 190 and a second external connection pad 291b may be formed on the upper re-wiring structure 203. The second external connection pad 291b may be electrically connected to the upper re-wiring layer 203a. When the second cover layer 190 is formed, a second external connection pad 291b may be more precisely formed.

The second cover layer 190 may include the same material as a material for forming an upper re-wiring insulating layer 203b. For example, the second cover layer 190 may be a transparent organic layer. The second cover layer 190 may be a photo imageable dielectric (PID) layer.

A package connection terminal 292 may be formed on the second external connection pad 291b. The upper package 200T' may be mounted on the package connection terminal 292. The upper package 200T' may be attached to the lower package 200B' with the package connection terminal 292 therebetween. The upper package 200T may include an upper semiconductor chip 231 attached to the upper package substrate 251.

The upper semiconductor chip 231 may include a first upper semiconductor chip 231a and a second upper semiconductor chip 231b. The first upper semiconductor chip 231a and the second upper semiconductor chip 231b may be connected to the upper package substrate 251 via a bonding wire 233. The upper semiconductor chip 231 may include a memory chip or controller chip. The upper package 200T' may include an upper encapsulation layer 255 surrounding at least part of the upper semiconductor chip 231.

FIGS. 16 through 19 are cross-sectional views schematically illustrating a method of manufacturing a fan-out semiconductor package according to an embodiment of the inventive concepts.

Figure 16:
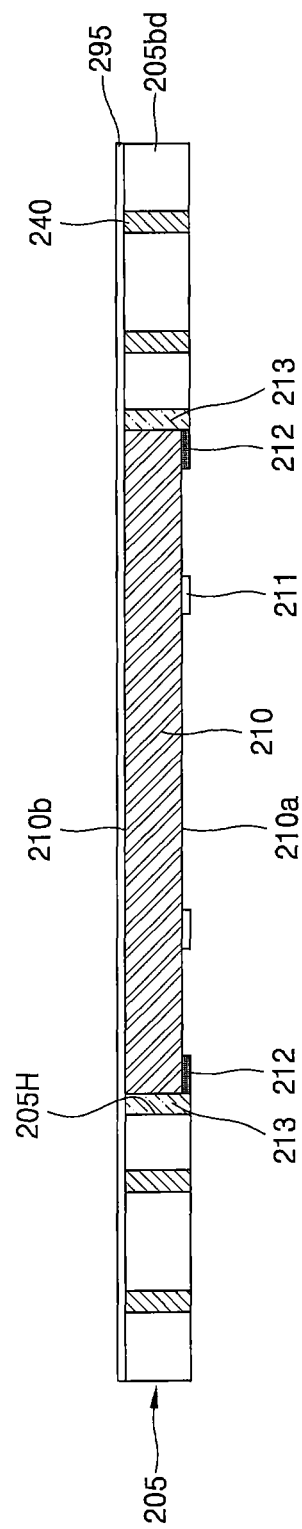
FIGS. 16 through 19 are cross-sectional views schematically illustrating a method of manufacturing a fan-out semiconductor package according to an embodiment of the inventive concepts.

In detail, FIGS. 16 through 19 are provided to describe a method of manufacturing the fan-out semiconductor package 200-3 of FIG. 15. Referring to FIG. 16, a frame substrate 205 having a through hole 205H in which a lower semiconductor chip 210 is to be accommodated, may be provided. The lower semiconductor chip 210 may be arranged within the through hole 205H. The lower semiconductor chip 210 may have an active surface 210a and an inactive surface 210b opposite to the active surface 210a. A pad structure 211 and a guard ring 212 may be formed on the active surface 210a.

A tape substrate 295 for fixing the lower semiconductor chip 210 may be provided to one surface of the frame substrate 205. The tape substrate 295 may have the shape of a film or support plate. In some embodiments, the tape substrate 295 may include polyimide. The frame substrate 205 may include the frame body 205bd. A via 240 may be arranged within the frame body 205bd.

Subsequently, an encapsulation layer 213 may be formed inside the through hole 205H and on side surfaces (e.g., opposite side surfaces) of the lower semiconductor chip 210. When the encapsulation layer 213 is formed, the encapsulation layer 213 may not be formed on most or all of the active surface 210a of the lower semiconductor chip 210 due to the guard ring 212 so that package defects may be reduced and/or prevented from occurring.

Figure 17:
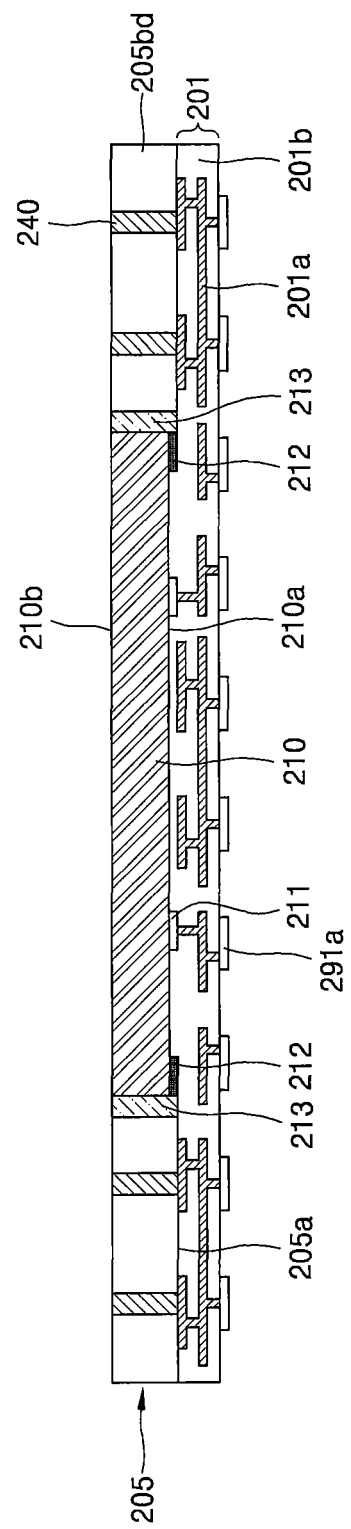

Referring to FIG. 17, after the tape substrate 295 is removed, a lower re-wiring structure 201 may be formed on the first surface 205a of the exposed frame substrate 205 and on the first surface 210a of the lower semiconductor chip 210. Here, the lower re-wiring structure 201 has been formed first. However, an upper re-wiring structure 203 to be described later may also be formed first.

A lower re-wiring insulating layer 201b may be formed so as to form the lower re-wiring structure 201. Subsequently, the lower re-wiring insulating layer 201b may be patterned to serve as a mold. Subsequently, a seed metallic layer may be formed within the patterned re-wiring insulating layer 201b, and the lower re-wiring layer 201a may be formed by using a plating method, such as electrolytic plating, electroless plating, or immersion plating.

This process may be performed once or may be performed a plurality of times as needed. In this way, a method of forming the lower re-wiring structure 201 is well-known to those skilled in the art. Thus, a detailed description thereof will be omitted. A first external connection pad 291a may be formed on the bottom surface of the lower re-wiring structure 201 and may be electrically connected to the lower re-wiring layer 201a.

Figure 18:
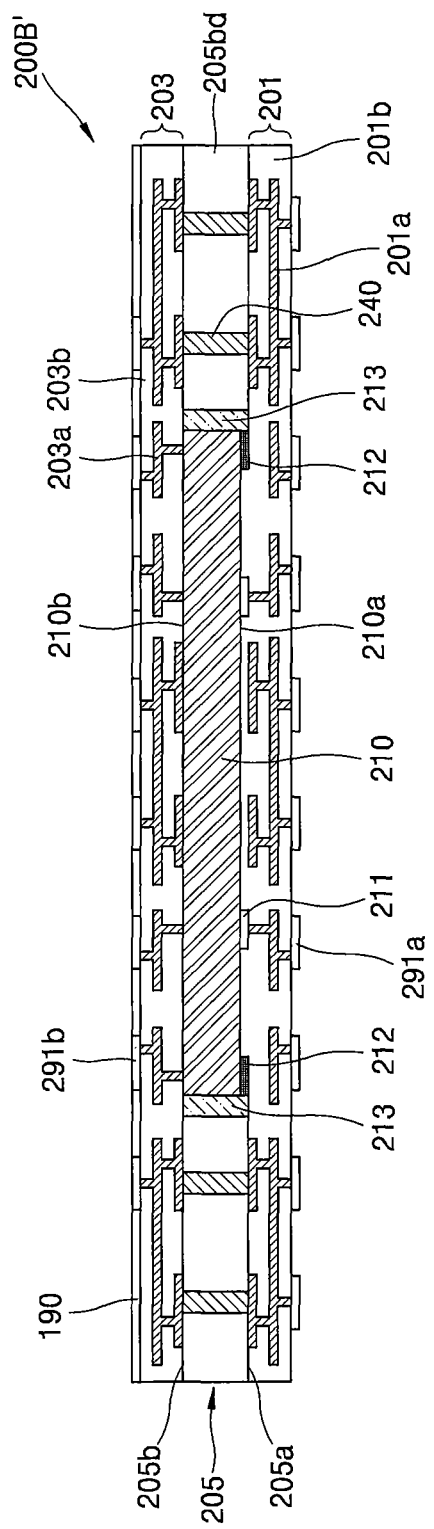

Referring to FIG. 18, the upper re-wiring structure 203 may be formed on the second surface 205b opposite to the frame substrate 205 by using the same method as that of FIG. 17. The upper re-wiring structure 203 includes an upper re-wiring layer 203a and an upper re-wiring insulating layer 203b. A method of forming the upper re-wiring structure 203 has been described in FIG. 17. Here, a redundant description therewith will be omitted.

A second cover layer 190 may be formed on the upper re-wiring structure 203. The second cover layer 190 may be a transparent organic layer. The second cover layer 190 may be a PID layer. After a plurality of contact holes for exposing the upper re-wiring layer 203a are formed by patterning the second cover layer 190, a second external connection pad 291b may be formed within the plurality of contact holes, thereby completing a lower package 200B'. The second external connection pad 291b may be formed on a portion electrically connected to the upper re-wiring layer 203a.

Figure 19:
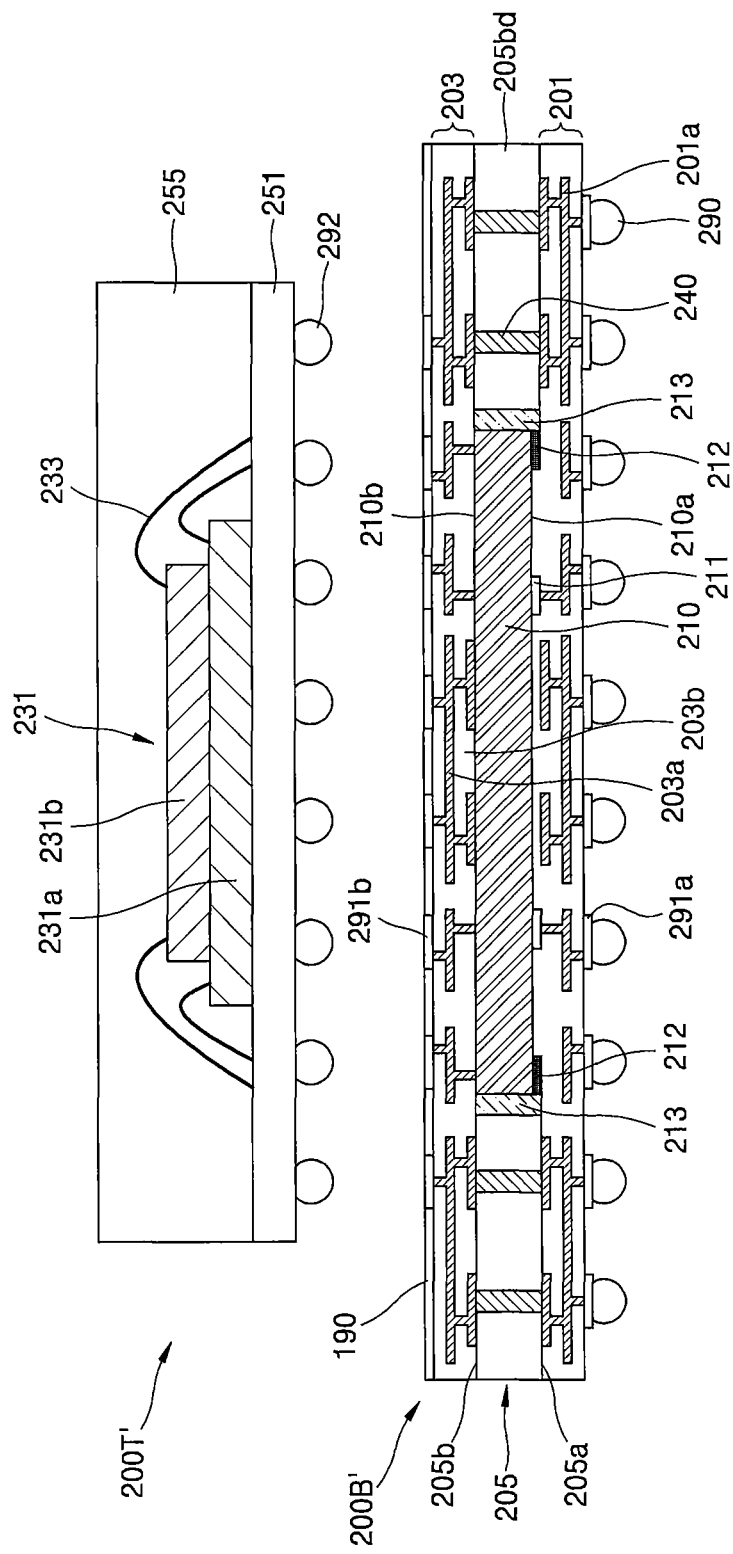

Referring to FIG. 19, an upper package 200T' is provided on a lower package 200B'. The upper package 200T' is formed by mounting the upper semiconductor chip 231 on the upper package substrate 251 by using the bonding wire 233 and is substantially the same as the upper package 200T of FIG. 15 and thus, a detailed description thereof will be omitted. Subsequently, as shown in FIG. 19, the upper package 200T' may be mounted on the lower package 200B' (e.g., via package connection terminal 292), thereby completing the fan-out semiconductor package 200-3.

Figure 20:
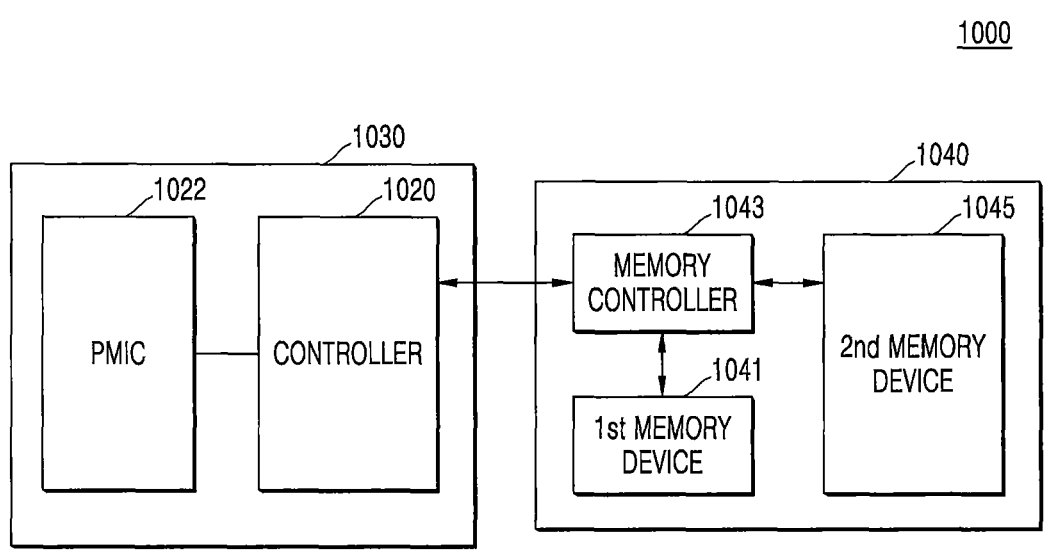
FIG. 20 is a view illustrating a configuration of a fan-out semiconductor package according to an embodiment of the inventive concepts.

FIG. 20 is a view illustrating a configuration of a fan-out semiconductor package according to an embodiment of the inventive concepts.

In detail, a semiconductor package 1000 may correspond to the fan-out semiconductor package 200-2 or 200-3 according to the inventive concepts. The semiconductor package 1000 may include a controller chip 1020, a first memory chip 1041, a second memory chip 1045, and a memory controller 1043. The semiconductor package 1000 may further include a power management integrated circuit (PMIC) 1022 for supplying current of an operating voltage to each of the controller chip 1020, the first memory chip 1041, the second memory chip 1045, and the memory controller 1043. Each operating voltage applied to each of components may be equally or differently designed.

The lower package 1030 including the controller chip 1020 and the PMIC 1022 may be the lower package 200B or 200B' of the inventive concepts described above. The upper package 1040 including the first memory chip 1041, the second memory chip 1045, and the memory controller 1043 may be the upper package 200T or 200T' of the inventive concepts described above.

The semiconductor package 1000 may be implemented to be included in a personal computer (PC) or a mobile device. The mobile device may be implemented with a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile Internet device (MID), a wearable computer, an Internet of Things (IoT) device, an Internet of everything (IoE) device, or a drone.

The controller chip 1020 may control an operation of each of the first memory chip 1041, the second memory chip 1045, and the memory controller 1043. For example, the controller chip 1020 may be implemented with an integrated circuit (IC), a system on chip (SoC), an AP, a mobile AP, a chip set, or a set of chips. For example, the controller chip 1020 may include a central processing unit (CPU), a graphics processing unit (GPU), and/or a modem. In some embodiments, the controller chip 1020 may perform a function of the modem and a function of the AP.

The memory controller 1043 may control the second memory chip 1045 according to control of the controller chip 1020. The first memory chip 1041 may be implemented with a volatile memory device. The volatile memory device may be implemented with a random access memory (RAM), a dynamic RAM (DRAM), or a static RAM (SRAM). However, embodiments are not limited thereto.

The second memory chip 1045 may be implemented with a storage memory device. The storage memory device may be implemented with a nonvolatile memory device. The storage memory device may be implemented with a flash-based memory device. However, embodiments are not limited thereto. The second memory chip 1045 may be implemented with a NAND-type flash memory device. The NAND-type flash memory device may include a two-dimensional memory cell array or three-dimensional memory cell array. The two-dimensional memory cell array or the three-dimensional memory cell array may include a plurality of memory cells, and each of the plurality of memory cells may store 1-bit information or 2-bit or more information.

When the second memory chip 1045 is implemented with the flash-based memory device, the memory controller 1043 may use (or support) a multimedia card (MMC) interface, an embedded MMC (eMMC) interface, or a universal flash storage (UFS) interface. However, embodiments are not limited thereto.

Figure 21:
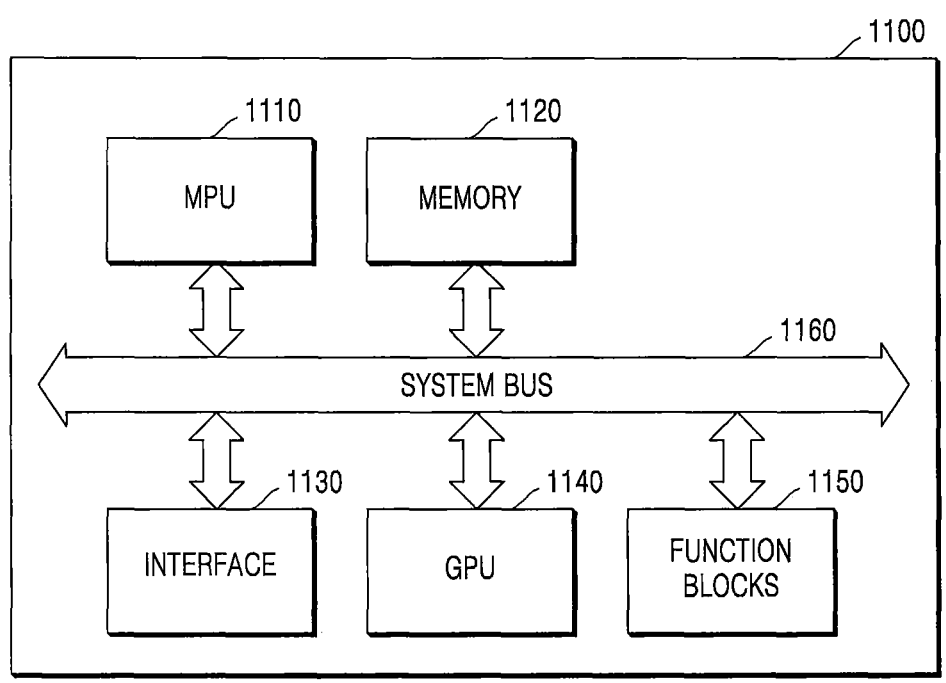
FIG. 21 is a block diagram schematically illustrating a configuration of a fan-out semiconductor package according to an embodiment of the inventive concepts.

FIG. 21 is a block diagram schematically illustrating a configuration of a fan-out semiconductor package according to an embodiment of the inventive concepts.

Specifically, a semiconductor package 1100 may include a micro processor unit (MPU) 1110, memory 1120, an interface 1130, a graphics processor unit (GPU) 1140, function blocks 1150, and a bus 1160 for connecting them. The semiconductor package 1100 may include all of the MPU 1110 and the GPU 1140 but may include only one thereof.

The MPU 1110 may include a core and a L2 cache. For example, the MPU 1110 may include a multi-core. Each core of the multi-core may have the same or different functions. Also, each core of the multi-core may be simultaneously activated, or an activation time of each core of the multi-core may differ. The memory 1120 may store the result of processing on the function blocks 1150 according to control of the MPU 1110. For example, as the contents stored in the L2 cache are flushed, the contents may be stored in the memory 1120 according to control of the MPU 1110. The interface 1130 may perform an interface with external devices. For example, the interface 1130 may perform an interface with a camera, a liquid crystal display (LCD), and a speaker.

The GPU 1140 may perform graphics functions. For example, the GPU 1140 may perform video codec or may process 3D graphics. The function blocks 1150 may perform various functions. For example, when the semiconductor package 1100 is an AP used in the mobile device, part of the function blocks 1150 may perform a communication function.

The semiconductor package 1100 may be the semiconductor package 200-2 or 200-3 described above in the inventive concepts. The MPU 1110 and/or the GPU 1140 may be the lower package 200B or 200B' described above. The memory 1120 may be the upper package 200T or 200T' described above. The interface 1130 and the function blocks 1150 may correspond to part of the lower package 200B or 2003 described above.

While the inventive concepts have been particularly shown and described with reference to embodiments thereof, it will be understood that various changes in form and details may be made therein without departing from the scope of the following claims.

What is claimed is:

1. A fan-out semiconductor package comprising:
a frame substrate comprising a through hole therein;
a semiconductor chip in the through hole, wherein the semiconductor chip comprises a chip body, a chip pad on a surface of the chip body, and a passivation layer on the chip body and on the chip pad;
an encapsulation layer on side surfaces of the semiconductor chip within the through hole; and
a guard ring on the passivation layer, on an edge portion of the chip body, and in direct contact with the encapsulation layer.

2. The fan-out semiconductor package of claim 1, wherein the guard ring comprises a continuous layer extending along a perimeter of the chip body in a plan view.

3. The fan-out semiconductor package of claim 1, wherein the guard ring is in contact with the passivation layer.

4. The fan-out semiconductor package of claim 1, wherein the guard ring is in contact with a side surface of the encapsulation layer.

5. The fan-out semiconductor package of claim 1, wherein a re-wiring structure that is electrically connected to the chip pad is on the frame substrate and on a surface of the semiconductor chip.

6. The fan-out semiconductor package of claim 1, wherein a multi-layer wiring structure is within the frame substrate, and
wherein a re-wiring structure that is electrically connected to the chip pad and the multi-layer wiring structure is on the frame substrate and on a top surface of the semiconductor chip.

7. The fan-out semiconductor package of claim 1, wherein the encapsulation layer is on a bottom surface of the chip body.

8. The fan-out semiconductor package of claim 1, wherein the encapsulation layer is on the edge portion of the chip body and an edge portion of the passivation layer.

9. The fan-out semiconductor package of claim 1, wherein a bottom surface of the chip body is at a lower level than a bottom surface of the frame substrate.

10. A fan-out semiconductor package comprising:
a frame substrate comprising a through hole therein;
a semiconductor chip in the through hole, wherein the semiconductor chip comprises a chip body, at least one chip pad on a surface of the chip body, a capping layer on the at least one chip pad, and a passivation layer on the chip body, on sides of the at least one chip pad, and on part of the capping layer;
an encapsulation layer on side surfaces of the semiconductor chip within the through hole; and
a guard ring on the passivation layer and on an edge portion of the chip body, the guard ring having a top surface at a level that is equal to or higher than a top surface of the encapsulation layer, and wherein the top surface of the guard ring is coplanar with a top surface of the capping layer.

11. The fan-out semiconductor package of claim 10, wherein the guard ring comprises a continuous layer extending along a perimeter of the chip body in a plan view.

12. The fan-out semiconductor package of claim 10, wherein a top surface of the passivation layer is at a lower level than the top surface of the encapsulation layer, and the guard ring is in contact with a side surface of the encapsulation layer.

13. The fan-out semiconductor package of claim 10, wherein the capping layer comprises a recess portion that is recessed from the top surface of the capping layer.

14. The fan-out semiconductor package of claim 10, wherein a re-wiring structure and a re-wiring pad electrically connected to the chip pad are on the frame substrate and on a surface of the semiconductor chip, and
wherein a package that is electrically connected to the re-wiring pad is on the re-wiring structure.

15. The fan-out semiconductor package of claim 10, further comprising a crack-reducing ring on an edge portion of a top surface of the chip body,
wherein the crack-reducing ring is within the passivation layer.

16. A fan-out semiconductor package comprising:
a frame substrate comprising a through hole therein;
a semiconductor chip in the through hole, wherein the semiconductor chip comprises a chip body, at least one chip pad on a surface of the chip body, and a passivation layer on the chip body and on side surfaces of the at least one chip pad, wherein a bottom surface of the chip body is at a same level as a bottom surface of the frame substrate;
an encapsulation layer on side surfaces of the semiconductor chip within the through hole; and
a guard ring on the passivation layer and on an edge portion of the chip body, the guard ring having a top surface at a level that is equal to or higher than a top surface of the encapsulation layer.

17. The fan-out semiconductor package of claim 16, further comprising a capping layer on the at least one chip pad,
wherein a top surface of the capping layer and the top surface of the guard ring are at a same level.

18. The fan-out semiconductor package of claim 16, wherein the top surface of the encapsulation layer is at a same level as a top surface of the passivation layer.

19. The fan-out semiconductor package of claim 16, wherein the guard ring is in contact with the passivation layer.

20. The fan-out semiconductor package of claim 16, wherein the guard ring continuously extends along a perimeter of the chip body in a plan view.

* * * * *